United States Patent [19]

Yoshizawa et al.

[11] Patent Number: 4,963,509
[45] Date of Patent: Oct. 16, 1990

[54] GOLD DIFFUSION METHOD FOR SEMICONDUCTOR DEVICES OF HIGH SWITCHING SPEED

[75] Inventors: Yutaka Yoshizawa, Sakado; Akira Uemura, Saitama, both of Japan

[73] Assignee: Sanken Electric Co., Ltd., Saitama, Japan

[21] Appl. No.: 450,223

[22] Filed: Dec. 12, 1989

[30] Foreign Application Priority Data

Dec. 16, 1988 [JP] Japan ................. 63-317711

[51] Int. Cl.⁵ .......................................... H01L 21/225
[52] U.S. Cl. .................... 437/142; 437/146; 437/154; 148/DIG. 38; 148/DIG. 62
[58] Field of Search .............. 437/94, 142, 6, 146, 437/154; 148/DIG. 37, DIG. 38, DIG.62

[56] References Cited

U.S. PATENT DOCUMENTS

| | | | |
|---|---|---|---|
| 3,184,347 | 5/1965 | Hoerni | 148/DIG. 62 |
| 3,440,113 | 5/1969 | Wolley | 148/DIG. 62 |
| 3,473,976 | 11/1969 | Castrucci et al. | 148/DIG. 62 |
| 3,645,808 | 2/1972 | Kamiyama et al. | 148/DIG. 62 |
| 3,864,174 | 2/1975 | Akiyama et al. | 148/DIG. 62 |
| 3,941,625 | 3/1976 | Kennedy et al. | 437/6 |
| 3,943,013 | 3/1976 | Kennedy et al. | 437/6 |

FOREIGN PATENT DOCUMENTS 54-55372 5/1979 Japan .

*Primary Examiner*—Olik Chaudhuri
*Assistant Examiner*—Gordon V. Hugo
*Attorney, Agent, or Firm*—Woodcock Washburn Kurtz Mackiewicz & Norris

[57] ABSTRACT

Gold is diffused into a silicon substrate by first depositing an ultrathin layer of gold on one of the main faces of the substrate and then by heating the substrate to a temperature range of about 300°–850° C., instead of to about 1000° according to the prior art. Then, following the removal of the remaining gold layer from over the substrate, the latter is reheated to a higher temperature ranging from about 700° C. to about 1000° C. for activating the diffused gold. The gold diffusion at the reduced temperature serves to decrease the surface irregularities of the substrate as a result of gold-silicon alloy zones created at the interface between gold layer and silicon substrate during the thermal diffusion process.

8 Claims, 2 Drawing Sheets

GOLD DIFFUSION METHOD FOR SEMICONDUCTOR DEVICES OF HIGH SWITCHING SPEED

BACKGROUND OF THE INVENTION

Our invention belongs to the art of fabricating semiconductor devices such as pn-junction diodes, Schottky-barrier diodes, transistors and thyristors. More particularly, our invention pertains to a method of diffusing gold into semiconductor substrates in the manufacture of such semiconductor devices with a view to the improvement of their switching characteristic.

The diffusion of gold into semiconductor substrates represents a familiar technique in the fabrication of high-speed rectifier diodes and other semiconductor devices. It aims at the improvement of the switching speed of the semiconductor devices through reduction of the lifetime of the minority carriers. According to a typical conventional method of gold diffusion, as adapted for the manufacture of pn-junction diodes, for example, a layer of gold is formed by vacuum deposition or by plating on one of the faces of a semiconductor wafer following the creation of a p- or n-type region in the wafer by impurity diffusion. Then the wafer with the gold layer thereon is heated to cause gold diffusion into the wafer by way of a lifetime killer.

This known method of gold diffusion has had a problem arising from the fact that the temperature at which gold is diffused is in inverse proportion to the resulting lifetime of the minority carriers. The higher the temperature, the shorter the minority carrier lifetime. Consequently, gold has had to be diffused at as high a temperature as 1000° C. or so for the provision of diodes for high speed applications.

We object to the gold diffusion at such high temperatures because of the resulting production of a multiplicity of minute zones of gold-silicon (Au—Si) alloy at the interface between the semiconductor substrate and the gold layer. The Au—Si zones have persisted after the gold layer has been etched away, with the consequent creation of irregularities on the exposed surface of the substrate. It has therefore been difficult to form an electrode of desired physical properties on this surface of the substrate. An increase in forward voltage has been unavoidable. The surface irregularities have also caused uneven current distribution, so that the diodes fabricated by this known method have been susceptible to breakdown by current surges. Additionally, considerable leakage current has been present when the diode is reverse biased.

We have also ascertained that the Au—Si zones and the resulting surface roughness of the semiconductor substrate, which are both causes of the various inconveniences listed above, become more and more pronounced with an increase in the temperature at which gold is diffused. Such inconveniences would, of course, be mitigated by lowering the temperature of gold diffusion. This represents no acceptable solution at all because then the diffused gold would less serve the purpose of reducing the minority carrier lifetime.

Another known solution is found in Japanese Unexamined Patent Publication No. 54-55372 laid open to public inspection on May 2, 1979. It teaches to diffuse gold into semiconductor wafers at temperatures above 1000° and subsequently to heat the wafers to 600° to 700° C. in order to provide desired reverse current and switching speed characteristics. It is, however, silent on the subject of how to reduce the Au—Si zones and resulting irregularities on the surface of the wafers.

SUMMARY OF THE INVENTION

We have hereby invented how to diffuse gold into semiconductor substrates in the fabrication of semiconductor devices without the noted deficiencies.

Briefly, our invention may be summarized as a gold diffusion method for use in the fabrication of a semiconductor device capable of high-speed switching operation. The method is such that there is formed a layer of gold on a prescribed face of a semiconductor substrate. The substrate with the gold layer thereon is then heated to a first prescribed temperature thereby causing gold diffusion from the gold layer into the substrate. Then, with the remains of the gold layer dissolved away or otherwise removed from over the substrate, the latter is heated to a second prescribed state, higher than the first prescribed temperature, for activating the diffused gold.

The first prescribed temperature, to which the substrate is heated for gold diffusion, can normally be from about 300° to 850° C. Diffused at these reduced temperatures, the gold can fully permeate the substrate with the creation of much less surface irregularities on the substrate than heretofore. Further, by being subsequently activated by the posttreatment heating at a higher temperature (e.g. from 700° to 1100° C.), the diffused gold has proved to well perform its intended function as a lifetime killer, contributing materially to the higher switching speed of the semiconductor device. This second heat treatment is carried out following the removal, as far as possible, of the gold layer that has remained on the substrate surface after the gold diffusion process, so that little or no alloying of the semiconductor material occurs with the remaining gold.

The above and other features and advantages of our invention and the manner of realizing them will become more apparent, and the invention itself will best be understood, from a study of the following description and appended claims, with reference had to the attached drawings showing the best mode of carrying out the invention.

DETAILED DESCRIPTION OF THE INVENTION

We will now describe the method of our invention in detail as adapted for the manufacture of a high-speed switching diode. FIGS. 1A–1D are illustrations of the sequential steps we followed for the fabrication of the switching diode shown completed in FIG. 1D.

Figure 1A:
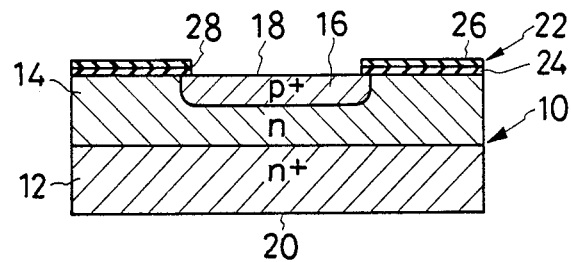
FIGS. 1A–1D are a series of sectional views explanatory of the sequential steps of fabricating a pn-junction switching diode by the method of our invention.

As illustrated in FIG. 1A, we first prepared a semiconductor substrate 10 in the form of a single crystal of silicon. The substrate 10 had an n+-type region 12, an n-type region 14 and a p+-type region 16. The n+-type region 12 was provided by the start material of the semiconductor substrate. We formed the n-type region 14, contiguous to the n+-type region 12, by epitaxial growth in the start material. The p+-type region 16 was formed by diffusion in the preformed n-type region 14. The n-type region 14 and the p+-type region 16 formed a pn junction therebetween.

It will be seen that generally boxlike in shape, the semiconductor substrate 10 has a pair of opposite main faces 18 and 20, with the p+-type region 16 exposed at the face 18 that is shown directed upwardly. Hereinafter in this specification we will refer to this upwardly directed face 18 of the substrate 10 as the top face, and to the other face 20 as the bottom face.

As shown also in FIG. 1A, we formed an insulating covering 22 on the top face of the substrate 10. The covering 22 was a lamination of a silicon oxide layer 24, in direct contact with the substrate 10, and a silicon nitride layer 26 overlying the silicon oxide layer. The covering 22 had an aperture 28 formed approximately centrally therein for use as a mask in creating the p+-type region 16 by selective diffusion. This aperture 28, exposing central part of the p+-type region 16 but not exposing the pn junction between the regions 14 and 16, is also to be used as a window through which gold is to be diffused into the substrate 10 subsequently.

Figure 1B:
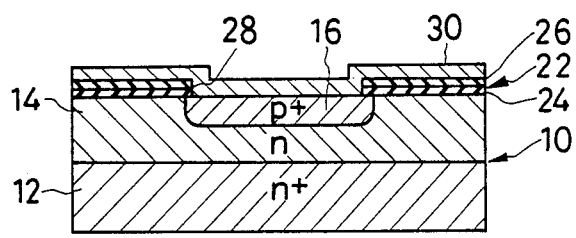

The next step, shown in FIG. 1B, was the creation of a thin layer 30 of gold on the insulating covering 22 and on the exposed surface of the P+-type region 16. We employed the familiar vacuum deposition technique for production of the gold layer 30. Being expensive, gold was deposited to a minimal thickness of approximately 0.01 micrometer.

Next came the step of diffusing the gold into the semiconductor substrate 10 as a lifetime killer. Toward this end we heated the substrate 10 with the gold layer 30 thereon to a temperature of about 850° C. and maintained it at that temperature for about 60 minutes. We suppose that the gold hardly permeated through the insulating covering 22 because of the high density of the silicon nitride layer 26 in particular. By virtue of its high coefficient of diffusion, however, the gold on introduction through the aperture 28 in the covering 22 diffused throughout the semiconductor substrate 10, including its portions just under the covering.

It should be noted that the gold layer 30 was formed on the exposed surface of the p+-type region 16, instead of on the bottom face 20 of the n+-type region 12 which contained phosphor as an impurity substance. The gold diffusion through the small window 28, rather than through the larger bottom face 20, was intended to prevent the phosphor from acting as a getter to absorb the diffused gold and hence to achieve an ideal gold distribution in the vicinity of the pn junction between n-type region 14 and p+-type region 16.

Figure 1C:
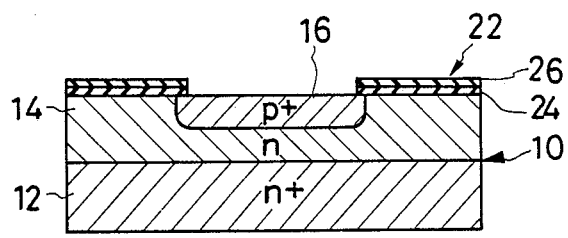

FIG. 1C shows the semiconductor substrate 10 from which the remains of the gold layer had been removed by dissolving them with aqua regia. Obviously, the above thermal gold diffusion process had also have created an Au—Si layer on the semiconductor substrate, which was hardly removable by aqua regia or other agent. However, the temperature of the gold diffusion process according to our invention was so low in comparison with that of the conventional practice that the resulting Au—Si layer created only negligible surface irregularities on the semiconductor region.

Then, following the removal of the remains of the gold layer 30, we heated the article of FIG. 1C again, this time to a temperature (1000° C.) higher than the temperature of the initial heat treatment for gold diffusion. We maintained FIG. 1C article at 1000° C. for about 60 minutes. Since the gold layer was no longer present on the substrate, this second heat treatment did not create any Au—Si layer thereon. Nor, obviously, was there practically any possibility of the remaining Au—Si zones growing as a result of this second heat treatment. We can therefore safely conclude that it was the initial heat treatment that determined the degree to which the semiconductor surface was roughed by the Au—Si alloy.

Figure 1D:
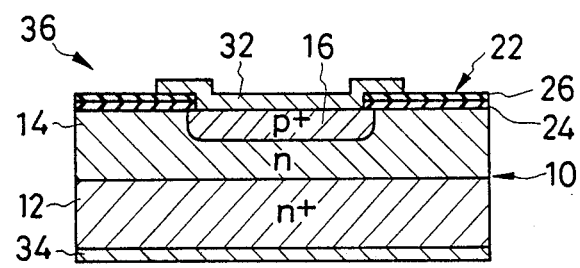

FIG. 1D shows the switching diode 36 completed by forming an anode 32 and a cathode 34 on the top and bottom faces, respectively, of the semiconductor substrate 12 after the second heat treatment. The anode 32 is electrically connected to the p+-type region 16, and the cathode 34 to the n+-type region 12. We formed the anode 32 by vapor deposition of aluminum, and the cathode 34 by nickel plating.

It is reasoned that the 1000° posttreatment heating of the semiconductor substrate, which followed gold diffusion at the reduced temperature of 850°, served to accelerate the function of the diffusate as a lifetime killer. For, despite the gold diffusion at the low temperature, the diode 36 produced as above exhibited a very high switching speed. We ascribe this high switching speed to the posttreatment heating at the elevated temperature.

Another advantage of our invention arises from the fact that the gold layer 30 is removed after the diffusion process and before the second heat treatment at 1000° C. The surface condition of the semiconductor substrate after the second heat treatment was substantially the same as after the initial heat treatment. Accordingly, the forward voltage, leakage current, and surge-withstanding capability of the diode 36 according to our invention were approximately the same as those of the diodes conventionally fabricated by gold diffusion at 850° C. and without posttreatment heating.

It will be noted from FIG. 1D that the apertured insulating covering 5, used as a mask for the production of the p+-type region 16 by selective diffusion, is left unremoved on the completed diode 36. This insulating covering would be damaged if the gold were diffused therethrough at higher temperatures than that according to our invention. The insulating covering has proved to suffer no such damage as the covering is subjected to the elevated temperature of the second heat treatment only after the removal of the gold layer 30.

We fabricated three groups of switching diodes, all through the procedure of FIGS. 1A-1D, but with the temperature of gold diffusion set at 850°, 900° and 1000° C., respectively. The temperature of the posttreatment heating was 1000° C. for all the groups of diodes. Then we proceeded to determine their reverse recovery waveforms, that is, the current waveforms when they are reverse biased after having been forward biased.

Figure 2:
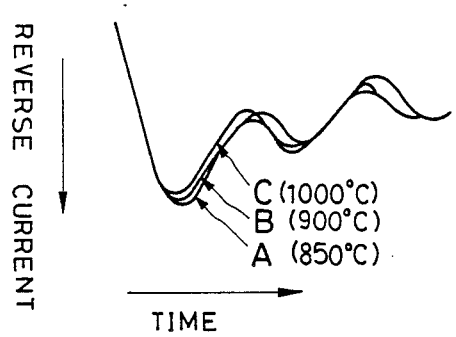
FIG. 2 is a graphic representation of the reverse recovery waveforms of the switching diodes formed through the procedure of FIGS. 1A–1D but with the different gold diffusion temperatures indicated.

FIG. 2 graphically shows the results. The curves A, B and C in the graph represent the average reverse recovery waveforms of the three groups of diodes that were fabricated as above with the gold diffusion temperatures of 850°, 900° and 1000° C., respectively. A comparison of the three curves A, B and C will show that the different temperatures of gold diffusion hardly affect the reverse recovery waveforms and reverse recovery times of the resulting diodes.

We have acertained from the same experiments, however, that the higher the temperature of gold diffusion, the more pronounced are the resulting surface irregularities of the semiconductor substrates as a result of the Au—Si alloy zones created by the gold diffusion. The temperature of gold diffusion should therefore be not more than about 850° C. in order to maintain such surface irregularities at an acceptable level. Of course, the lower the temperature of gold diffusion, the less pronounced are the resulting surface irregularities. However, the temperature should not be less than about 300° C. because at temperatures less than this lower limit, the amount of diffused gold has proved to become so little that it hardly serves the purpose of minority carrier lifetime reduction. We conclude from the foregoing results of experiments that the temperature of gold diffusion should be from about 300° to 850° C.

The temperature of the second heat treatment, or the posttreatment heating, should be higher than that of the first for accelerating the function of the diffused gold as a lifetime killer. More specifically, the temperature difference should be not less than 50° C., preferably not less than 100° C., and most desirably not less than 150° C., for sufficiently activating the diffused gold. Experiment has proved that this objective is hardly attainable when the temperature of the second heat treatment is less than 700° C. The gold would melt, however, if the temperature were raised to 1100° C. or more. We set, therefore, the temperature range of the second heat treatment from 700° to 1100° C.

Figure 3:
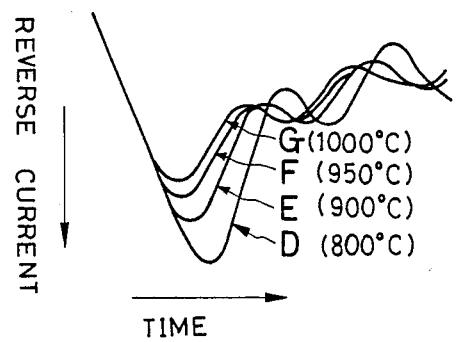
FIG. 3 is a graphic representation of the reverse recovery waveforms of some prior art switching diodes formed with the different gold diffusion temperatures indicated.

We have graphically indicated in FIG. 3 the reverse recovery waveforms of some prior art diodes which were constructed as shown in FIG. 1D but which were fabricated with no second heat treatment. The curves D, E, F and G in this graph represent the reverse recovery characteristics of the diodes formed with gold diffusion at temperatures of 850°, 900°, 950° and 1000° C., respectively. As will be understood from a comparison of FIGS. 2 and 3, the reverse recovery waveform A of the diode made with gold diffusion at 850° C. in accordance with the invention is equivalent to the reverse recovery waveform G of the prior art diode made with gold diffusion at 1000° C. We have already set forth the advantages gained by gold diffusion at reduced temperatures in accordance with our invention.

Although we have shown and described our invention in very specific aspects thereof and as adapted for the manufacture of pn-junction diodes, we do not wish our invention to be limited by the exact details of such disclosure. A variety of modifications alterations of the foregoing disclosure may be resorted to without departing from the scope of our invention. For example, a gold layer may be formed on the bottom face, instead of on the top face, of the semiconductor substrate for diffusing the gold therefrom.

What we claim is:

1. In the fabrication of a semiconductor device capable of high-speed switching operation, a method of gold diffusion which comprises:
   (a) providing a semiconductor substrate having a pair of opposite main faces;
   (b) forming a layer of gold on one of the main faces of the semiconductor substrate;
   (c) causing the diffusion of gold from the gold layer into the semiconductor substrate by heating the semiconductor substrate to a first predetermined temperature;
   (d) removing the remaining gold layer from the semiconductor substrate; and
   (e) activating the diffused gold by heating the semiconductor substrate to a second predetermined temperature that is higher than the first predetermined temperature.

2. The gold diffusion method of claim 1 wherein the first predetermined temperature is in the range of about 300°–850° C., and wherein the second predetermined temperature is in the range of about 700°–1100° C.

3. The gold diffusion method of claim 2 wherein the second predetermined temperature is at least 50° C. higher than the first predetermined temperature.

4. The gold diffusion method of claim 1 wherein the gold layer is formed by vapor deposition.

5. A method of fabricating a semiconductor device capable of high-speed switching operation, which method comprises:
   (a) providing a semiconductor substrate comprising a first region of a first conductivity type exposed at part of a first of a pair of opposite main faces of the substrate, and a second region of a second conductivity type, opposite to the first conductivity type, disposed contiguous to the first region and exposed at the first main face of the substrate so as to surround the first region, the first and second regions creating a pn-junction therebetween;
   (b) forming an insulating covering on the first main face of the semiconductor substrate, the insulating covering having an aperture exposing part of the first semiconductor region;
   (c) forming a layer of gold at least on that part of the first semiconductor region which is exposed through the aperture in the insulating covering;
   (d) causing the diffusion of gold from the gold layer into the semiconductor substrate by heating the semiconductor substrate, with the insulating covering formed thereon, to a first predetermined temperature;
   (e) removing the remaining gold layer from the exposed surface of the first semiconductor region;
   (f) activating the diffused gold by heating the semiconductor substrate to a second predetermined temperature that is higher than the first predetermined temperature; and
   (g) forming an electrode in electrical connection to the first semiconductor region.

6. The method of claim 5 wherein the insulating covering is a lamination of a silicon oxide layer and a silicon nitride layer.

7. The method of claim 5 wherein the gold layer is formed by vapor deposition on the exposed surface of the first semiconductor region as well as on the insulating covering.

8. A method of fabricating a semiconductor device capable of high-speed switching operation, which method comprises:
   (a) providing a semiconductor substrate comprising a first region of a first conductivity type exposed at part a first of a pair of opposite main faces of the substrate, and a second region of a second conductivity type, opposite to the first conductivity type, disposed contiguous to the first region and exposed at the first main face of the substrate so as to surround the first region, the first and second regions creating a pn-junction therebetween, the semiconductor substrate having an insulating covering on the first main face of the semiconductor substrate, the insulating covering having an aperture exposing part of the first semiconductor region;
(b) forming a layer of gold at least on that part of the first semiconductor region which is exposed through the aperture in the insulating covering;
(c) causing the diffusion of gold from the gold layer into the semiconductor substrate by heating the semiconductor substrate, with the insulating covering formed thereon, to a first predetermined temperature;
(d) removing the remaining gold layer from the exposed surface of the first semiconductor region;
(e) activating the diffused gold by heating the semiconductor substrate to a second predetermined temperature that is higher than the first predetermined temperature; and
(f) forming an electrode in electrical connection to the first semiconductor region.

* * * * *

UNITED STATES PATENT AND TRADEMARK OFFICE
CERTIFICATE OF CORRECTION

PATENT NO. : 4,963,509

DATED : October 16, 1990

INVENTOR(S) : Yoshizawa et al.

It is certified that error appears in the above-identified patent and that said Letters Patent is hereby corrected as shown below:

Col. 6, line 60   After "part" insert --of--.

Signed and Sealed this

Twentieth Day of October, 1992

*Attest:*

DOUGLAS B. COMER

*Attesting Officer*      *Acting Commissioner of Patents and Trademarks*